US011877427B2

United States Patent
Chang et al.

(10) Patent No.: US 11,877,427 B2
(45) Date of Patent: Jan. 16, 2024

(54) COVER FOR SOCKET OF FAN WALL

(71) Applicant: Quanta Computer Inc., Taoyuan (TW)

(72) Inventors: Chun Chang, Taoyuan (TW);
Hsin-Chieh Lin, Taoyuan (TW);
Chih-Hao Chang, Taoyuan (TW);
Yi-Fu Liu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 804 days.

(21) Appl. No.: 16/989,471

(22) Filed: Aug. 10, 2020

(65) Prior Publication Data
US 2021/0352829 A1    Nov. 11, 2021

Related U.S. Application Data

(60) Provisional application No. 63/020,706, filed on May 6, 2020.

(51) Int. Cl.
*H05K 7/00* (2006.01)
*H05K 7/20* (2006.01)
*H05K 9/00* (2006.01)

(52) U.S. Cl.
CPC ....... *H05K 7/20718* (2013.01); *H05K 9/0041* (2013.01)

(58) Field of Classification Search
CPC ......... H05K 7/20718; H05K 7/201727; H05K 7/20172; H05K 7/1487; H05K 7/1488; H05K 9/0041; H05K 5/023; H05K 5/03; E05C 17/00; E05C 17/02; E05C 17/46; E05C 17/52; E05B 65/006;

(Continued)

(56) References Cited

U.S. PATENT DOCUMENTS 289,311 A * 11/1883 Selby
2,669,499 A * 2/1954 Vanderplank ........... E05D 15/58
49/257

(Continued)

FOREIGN PATENT DOCUMENTS

CH    497157    * 10/1970
DE    2813104   *  9/1979

(Continued)

OTHER PUBLICATIONS

KR20170141916 English translation (Year: 2017).*

*Primary Examiner* — Janet M Wilkens
(74) *Attorney, Agent, or Firm* — NIXON PEABODY LLP

(57) ABSTRACT

A cover for covering an opening of a socket formed by a housing comprises a body; one or more bosses extending from the body, a first locking mechanism, a second locking mechanism, and a release tab. The bosses movably couple the body to the housing such that the body is movable between first and second positions. The first locking mechanism releasably attaches to the housing to secure the body in the first position. The second locking mechanism releasably attaches to the housing to secure the body in the second position. The release tab aids in detaching the first locking mechanism from the first wall and the second locking mechanism from the second wall. When the body is in the first position, the body allows access to the socket through the opening. When the body is in the second position, the body prevents access to the socket through the opening.

19 Claims, 15 Drawing Sheets

(58) Field of Classification Search
CPC ......... Y10T 292/0894; Y10T 292/0902; Y10T 292/0905; Y10T 292/42; Y10T 292/438; Y10S 292/11; Y10S 292/38; A47B 63/02; A47B 61/00; E05Y 2900/212; E05D 15/58
USPC .................... 312/213, 322, 323; 49/449, 450
See application file for complete search history.

(56) References Cited

U.S. PATENT DOCUMENTS

| | | | | |
|---|---|---|---|---|
| 3,161,923 A | * | 12/1964 | Crain ................. | E05B 65/0835 |
| | | | | 292/228 |
| 4,641,896 A | * | 2/1987 | Iimura ..................... | E06B 3/50 |
| | | | | 49/257 |
| 4,945,972 A | * | 8/1990 | Takeuchi .............. | E05D 15/264 |
| | | | | 49/257 |
| 5,083,847 A | * | 1/1992 | Peters .................... | E05D 15/58 |
| | | | | 312/322 |
| 2006/0221580 A1 | * | 10/2006 | Bliven ................... | G06F 1/181 |
| | | | | 361/727 |
| 2007/0236113 A1 | * | 10/2007 | McCambridge ........ | E06B 3/367 |
| | | | | 312/204 |
| 2015/0189776 A1 | * | 7/2015 | Mao ......................... | G06F 1/18 |
| | | | | 312/309 |
| 2020/0396862 A1 | * | 12/2020 | Tsorng ................. | F04D 25/166 |
| 2023/0109427 A1 | * | 4/2023 | Tsorng .................... | H05K 5/03 |
| | | | | 361/679.02 |

FOREIGN PATENT DOCUMENTS

EP            3528084     *   8/2019
KR       20170141916     *   12/2017

* cited by examiner

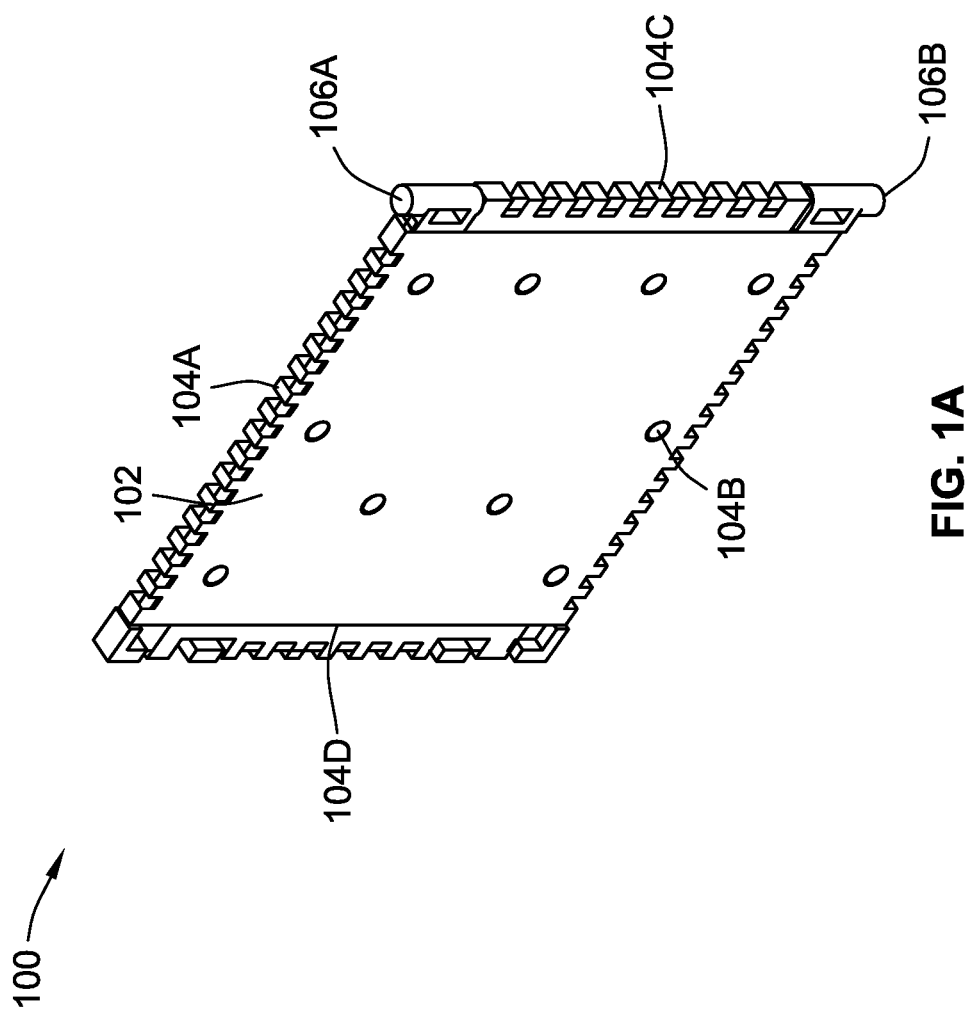

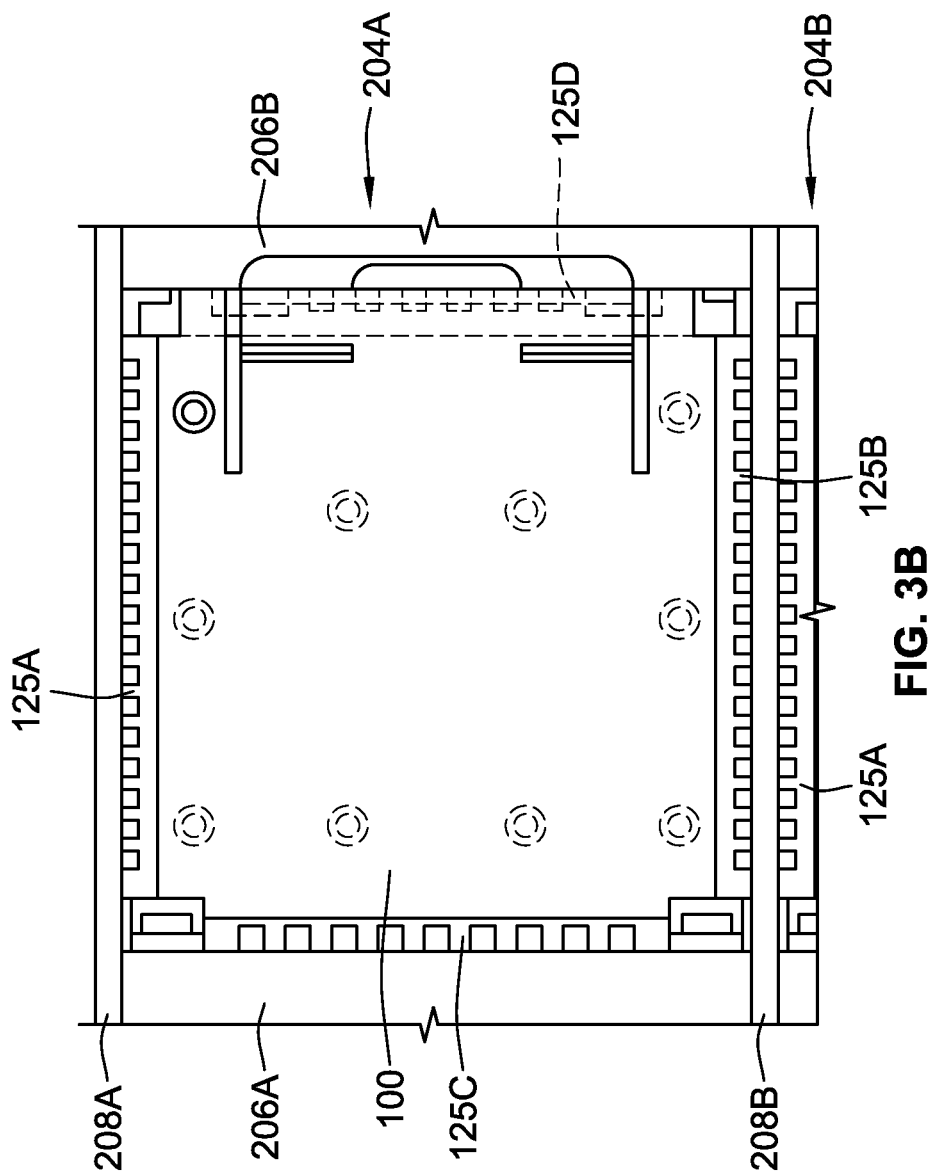

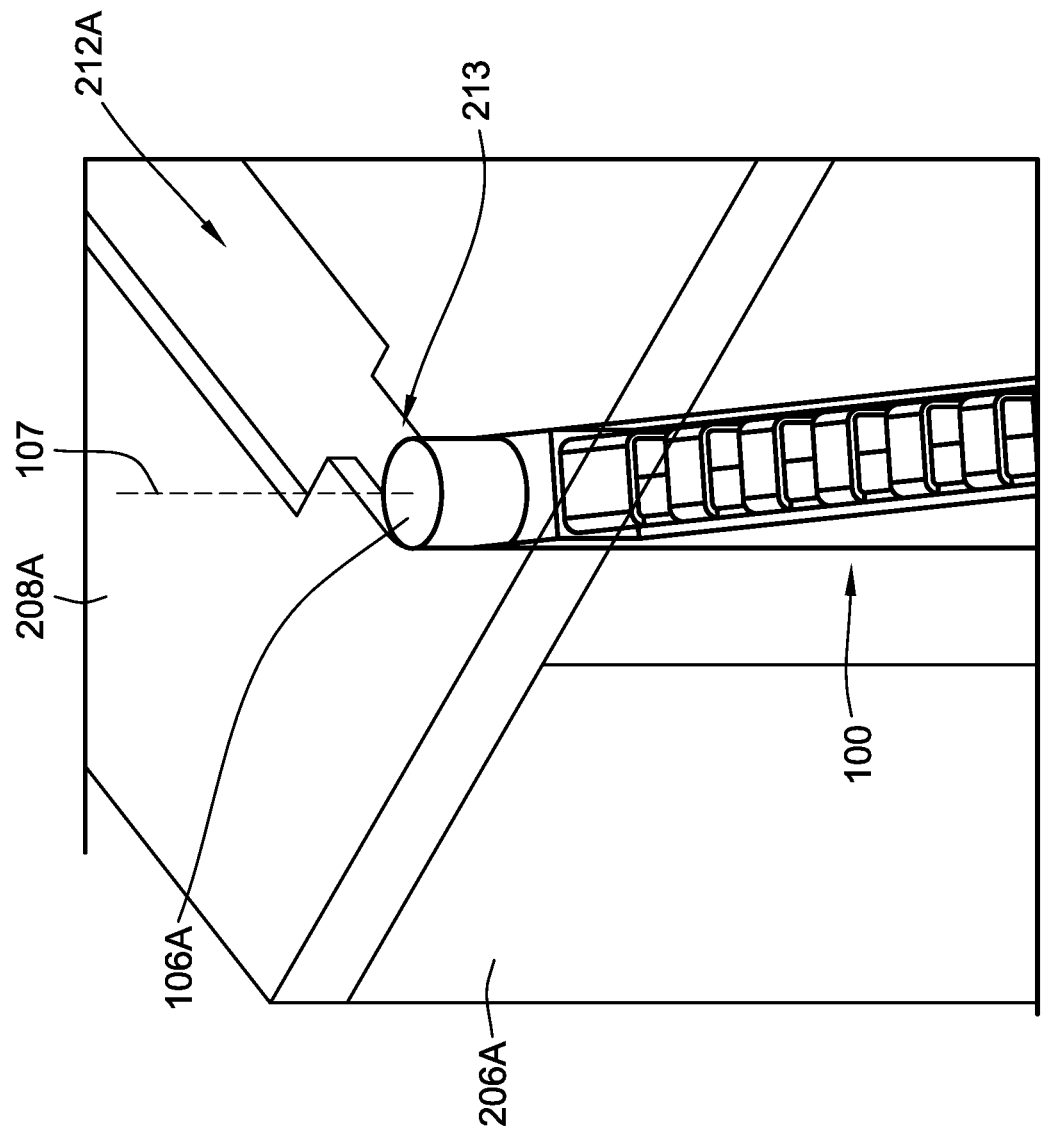

COVER FOR SOCKET OF FAN WALL

CROSS-REFERENCE TO RELATED APPLICATIONS

This application claims priority under 35 U.S.C. § 119 to U.S. Provisional Application No. 63/020,706, entitled "Dummy Cover For Channel Applications," and filed on May 6, 2020. The contents of that application are hereby incorporated by reference herein in their entirety.

TECHNICAL FIELD

The present disclosure relates generally to systems and methods for covering sockets of a fan wall. More particularly, aspects of this disclosure relate to a cover that can be secured in a first position to allow access to a socket of a fan wall, and in a second position to prevent access to the socket of the fan wall.

BACKGROUND

Computing devices (such as servers) generally include a chassis (e.g., a housing) and a variety of different electronic components positioned inside the chassis. Such devices can include a "fan wall," which is a portion of the housing that defines one or more sockets into which fan modules may be inserted.

Occasionally, a fan wall may have more sockets than installed fan modules, leaving one or more sockets vacant. For example, during maintenance or upgrading of a fan module, the fan module may be removed for a period of time before the repaired or new fan module is installed. To avoid downtime, the computing device may need to continue operating. However, a vacant socket can lead to undesirable air recirculation, since air passing through the vacant socket can be inadvertently directed through adjacent installed fan modules. To avoid such air recirculation, a cover can be installed in a vacant socket to block air flow through the socket. These covers are traditionally made of sheet metal and are available as a separate piece that can be snapped in place in a socket. Installation of these covers generally involves finding an appropriate cover that fits the vacant socket, then fitting the cover into place over the socket and snapping it into place. Not only do these tasks take substantial time, but a supply of covers in appropriate sizes must be maintained for all chassis used in a particular location. Additionally, because of their all-metal design, these covers are generally stored away from the chassis to avoid electromagnetic interference.

SUMMARY

The various examples of the present disclosure are directed toward a cover for covering an opening of a socket formed by a housing. In a first embodiment of the present disclosure, the cover comprises a body, one or more bosses extending from the body, a first locking mechanism, a second locking mechanism, and a release tab. The one or more bosses extend from the body, and are configured to movably couple the body to the housing such that the body is movable between a first position and a second position. The first locking mechanism is configured to releasably attach to a first wall of the housing to secure the body in the first position. The second locking mechanism is configured to releasably attach to a second wall of the housing to secure the body in the second position. The release tab is operable to aid in causing the first locking mechanism to detach from the first wall and the second locking mechanism to detach from the second wall. When the body is moved to the first position, the body allows access to the socket through the opening. When the body is moved to the second position, the body prevents access to the socket through the opening.

In some cases, the body has a shape that is generally identical to a shape of the opening of the socket.

In some cases, the body includes a first body portion coupled to a second body portion. The first body portion is formed from an electrically insulating material, and the second body portion is formed from an electrically conductive material. In some cases, the one or more bosses, the first locking mechanism, the second locking mechanism, and the release tab are all integrally formed with and extend from the first body portion. In some cases, the first body portion includes one or more projections extending from a surface of the first body portion, and the second body portion includes one or more apertures defined therethrough. Each of the one or more projections is configured to fit into a corresponding one of the one or more apertures.

In some cases, the one or more bosses are configured to be inserted into one or more tracks defined by the housing. In some cases, the one or more bosses include a first boss configured to be inserted into a first track of the housing, and a second boss configured to be inserted into a second track of the housing. The first track is defined by an upper wall of the housing, and the second track is defined by a lower wall of the housing.

In some cases, the one or more bosses are configured to move relative to housing such that the body moves from the first position to an intermediate position. In response to being moved to the intermediate position, the body is configured to rotate about the one or more bosses from the intermediate position to the second position. In some cases, the body is disposed within the socket when in the first position; the body extends out of the socket through the opening when in the intermediate position; and the body is disposed within the socket when in the second position. In some cases, when the body is in the first position, the body is unable to rotate about the one or more bosses between the first position and the second position.

In some cases, the first locking mechanism includes a first protrusion extending from the body and configured to be inserted through an aperture defined in the first wall of the housing. In some cases, the first protrusion is larger than the aperture defined in the first wall. The first protrusion is configured to deform in response to force being applied to the first protrusion, thereby allowing the first protrusion to pass through the aperture defined in the first wall. In some cases, the second locking mechanism includes a second protrusion extending from the body and configured to be inserted through an aperture defined in the second wall of the housing. In some cases, the second protrusion is larger than the aperture defined in the second wall. The second protrusion is configured to deform in response to force being applied to the second protrusion, thereby allowing the second protrusion to pass through the aperture defined in the second wall. In some cases, the release tab is configured to cause the first projection to detach from the first wall in response to a first force being imparted on the release tab when the body is in the first position. The release tab is configured to cause the second projection to detach from the second wall in response to a second force being imparted on the release tab when the body is in the second position.

In some cases, the socket is configured to receive a fan module. The body allows the fan module to be inserted into the socket when the body is in the first position. The body blocks airflow through the socket when the fan module is removed from the socket and the body is in the second position.

In some cases, the release tab is configured to cause the first locking mechanism to detach from the first wall of the housing in response to force being imparted on the release tab in a first direction when the body is in the first position. The release tab is configured to cause the second locking mechanism to detach from the second wall of the housing in response to force being imparted on the release tab in a second direction when the body is in the second position. The first direction is different than the second direction. In some cases, the release tab is configured to cause the first locking mechanism to attach to the first wall of the housing in response to force being imparted on the release tab in a third direction when the body is in the first position. The release tab is configured to cause the second locking mechanism to detach from the second wall of the housing in response to force being imparted on the release tab in a fourth direction when the body is in the second position. The third direction is parallel to and opposite of the first direction. The fourth direction is parallel to and opposite of the second direction.

In some cases, when the body is in the second position, the body blocks airflow through the socket.

In a second embodiment of the present disclosure, a system comprises a housing and a cover. The housing defines at least one socket configured to receive a fan module. The housing includes a first sidewall, a second sidewall spaced apart from the first sidewall, an upper wall coupled to a first end of the first sidewall and a first end of the second sidewall, and a lower wall coupled to a second opposing end of the first sidewall and a second opposing end of the second sidewall. The socket is defined by at least the first sidewall, the second sidewall, the upper wall, and the lower wall. The cover comprises a body, one or more bosses extending from the body, a first locking mechanism, a second locking mechanism, and a release tab. The one or more bosses extend from the body, and are configured to movably couple the body to the housing such that the body is movable between a first position and a second position. The first locking mechanism is configured to releasably attach to the housing to secure the body in the first position. The second locking mechanism is configured to releasably attach to the housing to secure the body in the second position. The release tab is operable to aid in causing the first locking mechanism to detach from the first wall and the second locking mechanism to detach from the second wall. When the body is moved to the first position, the body allows access to the socket through the opening. When the body is moved to the second position, the body prevents access to the socket through the opening.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

FIG. 1A is a perspective view of an example cover for covering an opening of a socket of a fan wall, according to aspects of the present disclosure.

FIG. 3B is a front view of the example cover of FIG. 1A coupled to the fan wall of FIG. 3A, according to aspects of the present disclosure.

FIG. 7B is a perspective view of a boss of the example cover rotating within a channel of the fan wall as the example cover moves from the intermediate position to the second position, according to aspects of the present disclosure.

Figure 1B:
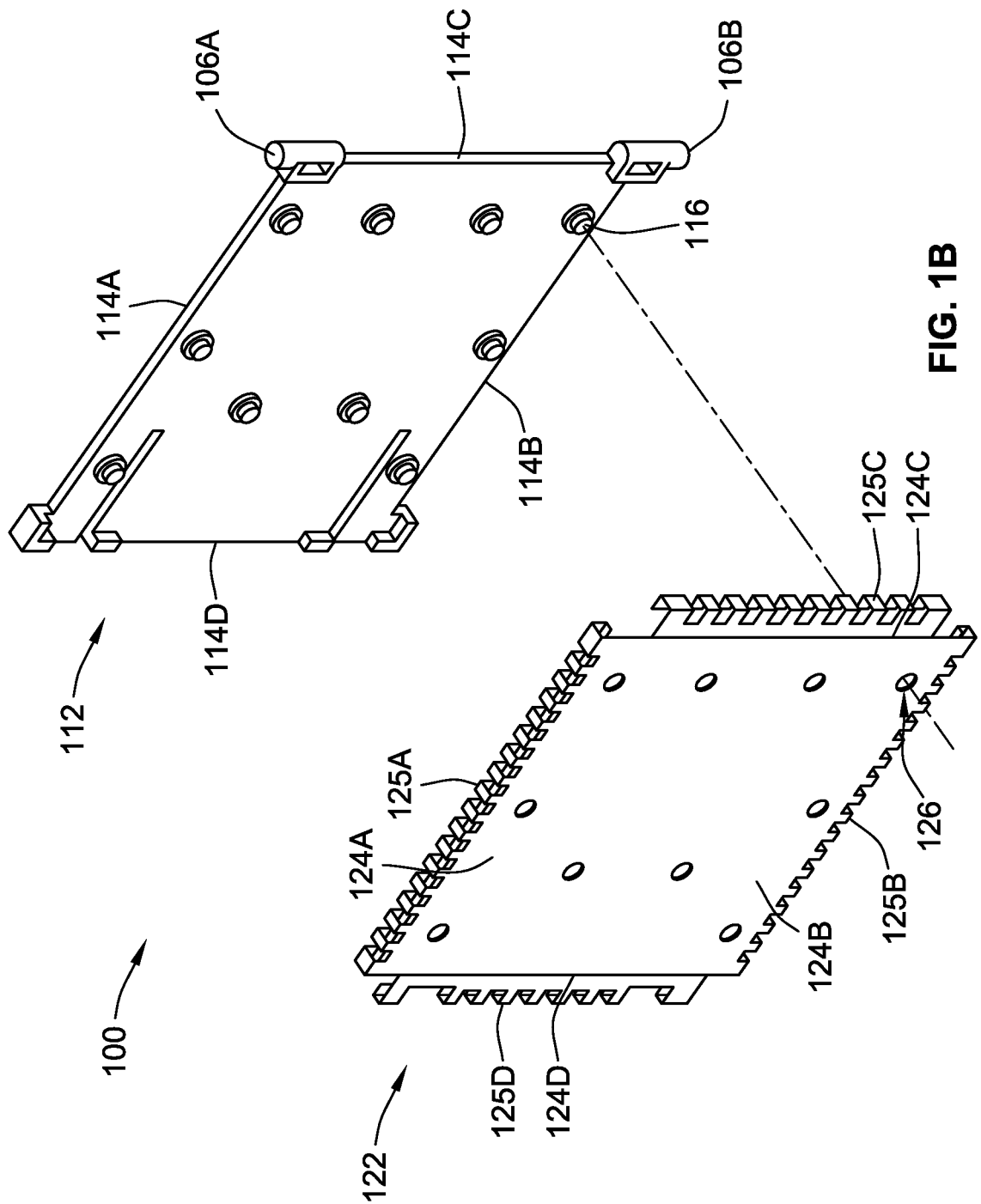
FIG. 1B is an exploded view of the components of the example cover of FIG. 1A, according to aspects of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

FIG. 1A is a perspective view of an example cover 100 that can be used to selectively block the opening of a socket formed by a housing of a device (such as a server device). The cover includes a body 102 that has a generally square shape. The body 102 is bounded by opposing upper and lower edges 104A, 104B, and opposing first and second side edges 104C, 104D. The cover 100 further includes bosses 106A and 106B that extend from the body 102. The boss 106A extends from an end of the upper edge 104A nearest the first side edge 104C, while the boss 106B extends from an end of the lower edge 104B nearest the first side edge 104C.

FIG. 1B is an exploded view of the cover 100. As shown, the body 102 is formed from a first body portion 112 and a second body portion 122 that are coupled to each other. The edges of the body 102 are formed from corresponding edges of the first body portion 112 and the second body portion 122. An upper edge 114A of the first body portion 112 and an upper edge 124A of the second body portion 122 form the upper edge of the body 102. A lower edge 114B of the first body portion 112 and a lower edge 124B of the second body portion 122 form the lower edge of the body 102. A first side edge 114C of the first body portion 112 and a first side edge 124C of the second body portion 122 form the first side edge of the body 102. A second side edge 114D of the first body portion 112 and a second side edge 124D of the second body portion 122 form the second side edge of the body 102.

Each edge 124A-124D of the second body portion 122 is formed from a series of ridges. Edge 124A is formed from ridges 125A. Edge 124B is formed from ridges 125B. Edge 124C is formed from ridges 125C. Edge 124D is formed from ridges 125D. As shown, the ridges 125A-125D extend outward from edges 124A-124D, and also toward the first body portion 112. The ridges 125A-125D are U-shaped, and hook over edges 114A-114D of the first body portion 112, when the first body portion 112 and the second body portion 122 are coupled together.

The square shape of the body 102 is formed by the square shapes of the first body portion 112 and the second body portion 122. The square shape of the body 102 generally corresponds to the shape of the opening in the socket to which the cover 100 is coupled. Thus, the body 102 is appropriately sized so as to block airflow through the socket when in the second position.

In the illustrated implementation, the bosses 106A and 106B are integrally formed with the first body portion 112. The boss 106A thus extends from the end of the upper edge 114A nearest to the first side edge 114C, and the boss 106B extends from the end of the lower edge 114B nearest to the first side edge 114C. In other implementations, the bosses 106A and 106B could be formed with and extending from the second body portion 122, or both the first body portion 112 and the second body portion 122.

The first body portion 112 includes one or more projections 116 extending from the first body portion 112. The second body portion 122 includes one or more apertures 126 defined through the second body portion 122. Each of the projections 116 is configured to fit into a corresponding one of the apertures 126, to thereby couple the first body portion 112 and the second body portion 122. In some implementations, the projections 116 are secured within the apertures 126 via a friction fit between the projections 116 and the edges of the apertures 126 (e.g., the portions of the second body portion 122 that form the peripheries of the apertures 126). Other methods or techniques for coupling the first body portion 112 to the second body portion 122 can also be used.

In some implementations, the first body portion 112 is formed from an electrically insulating material, such as glass, porcelain, non-conductive polymers, rubber, etc., or combinations thereof. The second body portion 122 can then be formed from an electrically conductive material, such as copper, silver, gold, conductive polymers, graphite, etc. The two-part construction of the cover 100 can prevent any inadvertent electromagnetic interference affecting the operation of the fan modules.

Figure 2A:
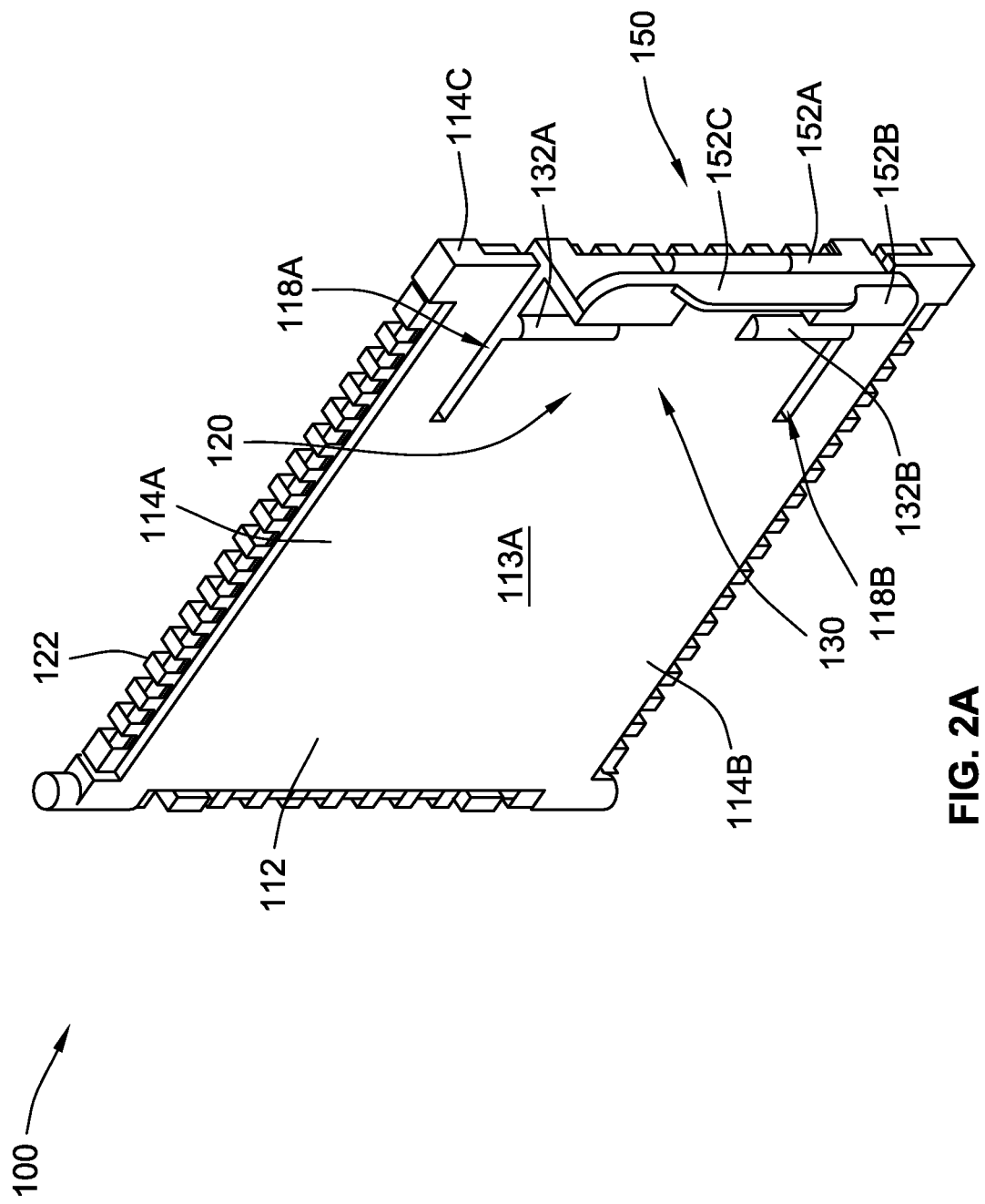
FIG. 2A is a perspective view of a first locking mechanism and a release tab of the example cover of FIG. 1A, according to aspects of the present disclosure.

FIG. 2A is a first perspective view of a first locking mechanism 130 and a release tab 150 of the example cover 100. The first body portion 112 includes a flap 120 that is formed by two slits 118A and 118B that are defined in the first body portion 112. The first locking mechanism 130 and the release tab 150 are both integrally formed with the first body portion 112, and specifically with the flap 120. In other implementations, the first body portion 112 does not include the flap 120. In still other implementations, the first locking mechanism 130 and/or the release tab 150 are separate components that can be coupled to the first body portion 112 and/or the second body portion 122. In some implementations, the first body portion 112 is formed from a flexible material, such that the flap 120 is deflectable relative to the plane of the first body portion 112.

The release tab 150 is formed from the area of the first side edge 114C of the first body portion 112 that is between the two slits 118A and 118B. The release tab 150 is formed from three tab portions 152A, 152B, 152C. The tab portion 152A extends generally perpendicular to the first body portion 112 and the second body portion 122. The tab portion 152B extends generally perpendicularly from the tab portion 152A, and is generally parallel to the first body portion 112 and the second body portion 122. Finally, the tab portion 152C extends generally perpendicularly from the tab portion 152A. The tab portion 152C is generally parallel to the tab portion 152A. The tab portion 152C is also perpendicular to the tab portion 152B, the first body portion 112, and the second body portion 122.

The first locking mechanism 130 is formed from two protrusions 132A and 132B extending outward from a side surface 113A. The side surface 113A forms one side of the first body portion 112 and the flap 120. The protrusions 132A and 132B are elongated ridges that also extend in the direction between the upper edge 114A and the lower edge 114B of the first body portion 112. During use, a technician can impart force on the release tab 150 to detach the first locking mechanism 130 from the housing.

Figure 2B:
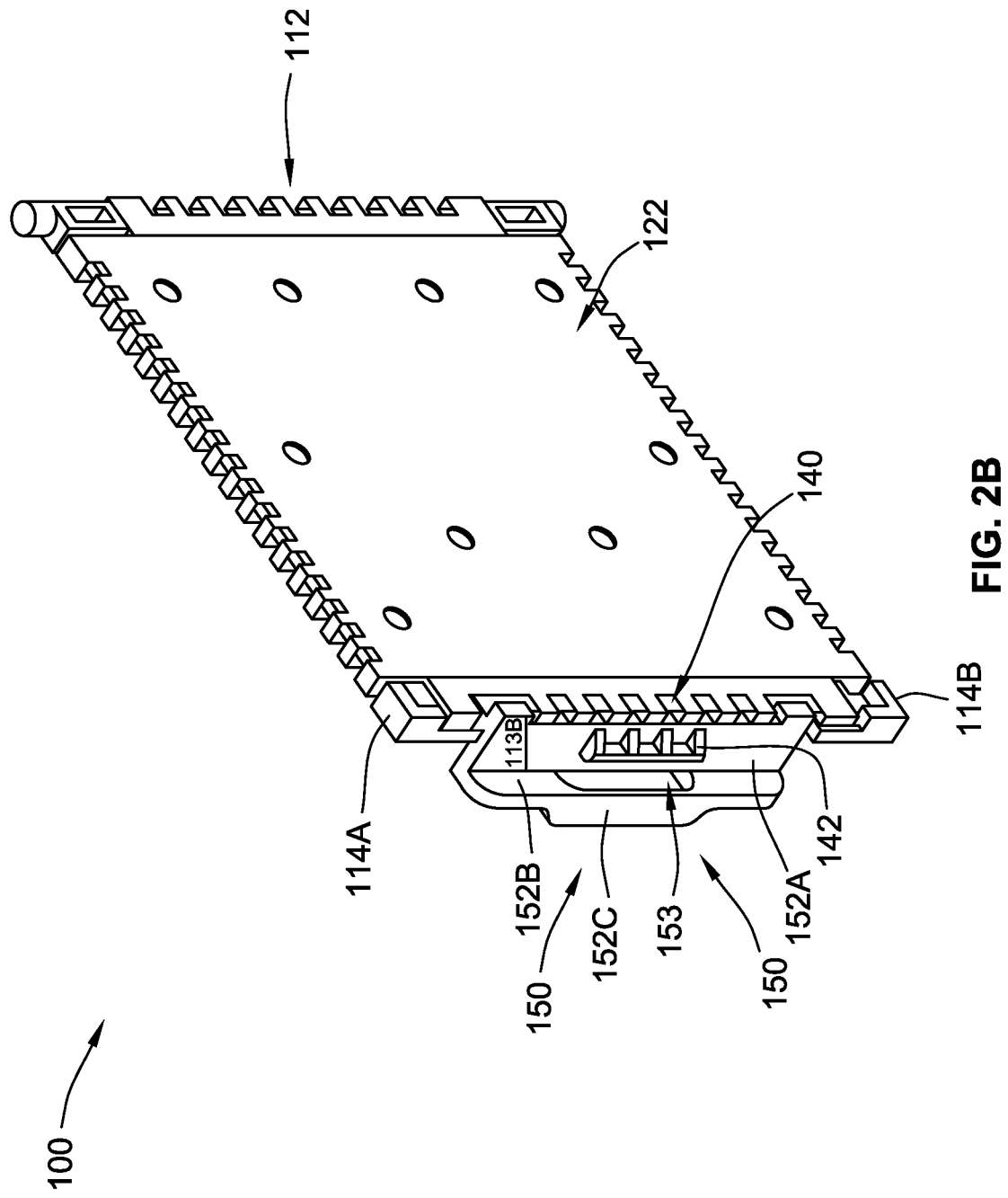
FIG. 2B is a perspective view of a second locking mechanism and the release tab of the example cover of FIG. 1A, according to aspects of the present disclosure.

FIG. 2B is a second perspective view of a second locking mechanism 140 and the release tab 150 of the cover 100. In the illustrated implementation, the second locking mechanism 140 is formed integrally with the first body portion 112.

In other implementations however, the second locking mechanism 140 is a separate component that can be coupled to the first body portion 112 and/or the second body portion 122. The second locking mechanism 140 is formed from a protrusion 142 that extends outward from an edge surface 113B of the tab portion 152A of the release tab 150. The edge surface 113B faces generally perpendicular to the side surface 113A (FIG. 2A) of the first body portion 112. The protrusion 142 forming the second locking mechanism 140 is an elongated ridge that also extends in the direction between the upper edge 114A of the first body portion 112 and the lower edge 114B of the first body portion 112. During use, a technician can impart force on the release tab 150 to detach the second locking mechanism 140 from the housing. In some implementations, the tab portion 152B of the release tab 150 can define an aperture 153. The aperture 153 can aid the technician in grasping the release tab 150.

Figure 3A:
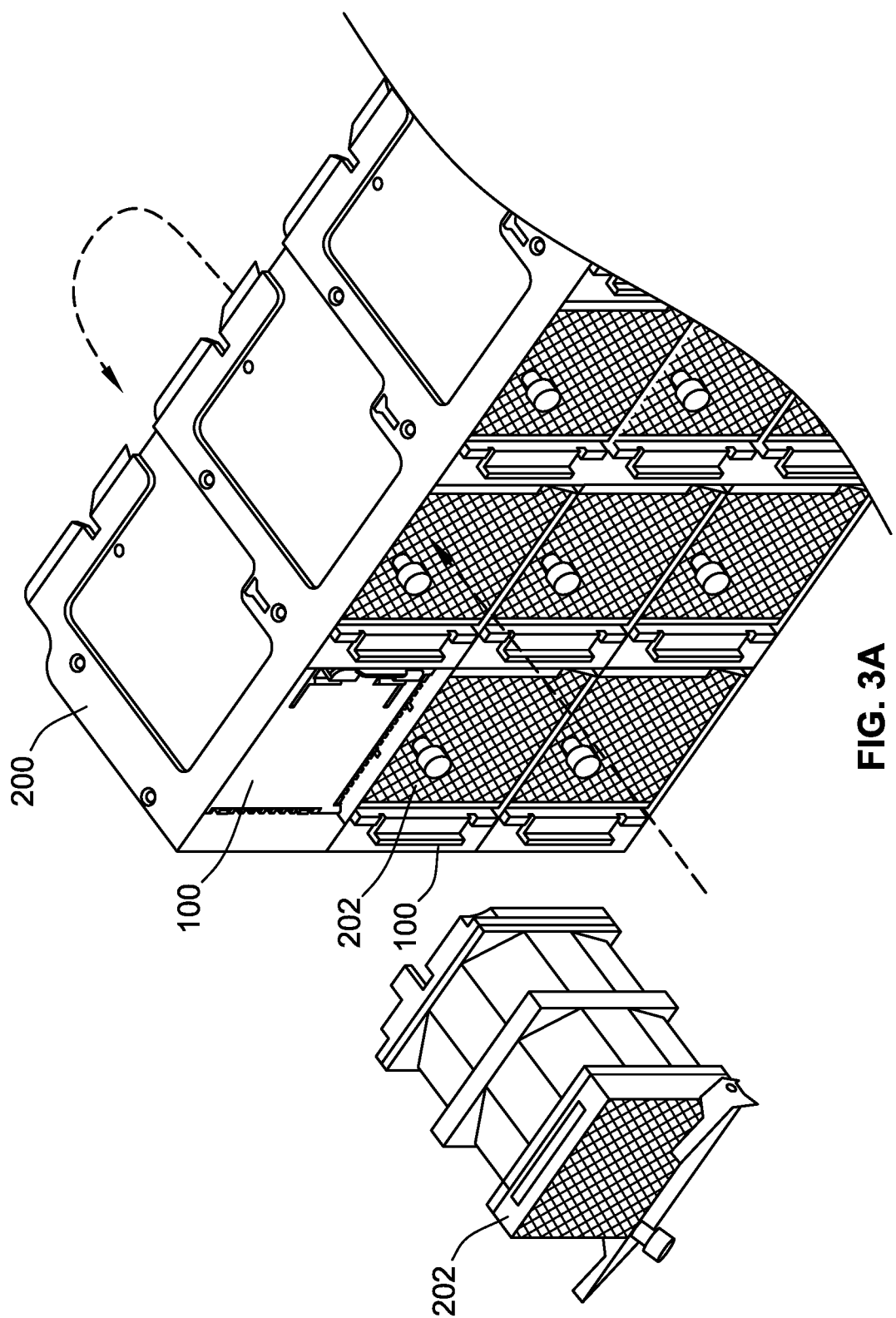
FIG. 3A is a perspective view of the example cover of FIG. 1A coupled to a fan wall, according to aspects of the present disclosure.

FIG. 3A is a perspective view of the cover 100 installed at each socket of a housing 200 of a computing device. In the implementation illustrated in FIG. 3A, the housing 200 is a fan wall that is configured to hold multiple fans. The fans are configured to cause air to move through the computing device, when installed in sockets of the housing 200. In other implementations, the housing 200 could be configured to hold other types of modules.

The fans can be inserted into and removed from sockets defined by the housing 200. A fan module 202 has been removed from the upper-left socket of the housing 200. The cover 100 is in the second (deployed) position, to block the empty socket. However, the remaining sockets of the housing 200 (such as the socket immediately below the upper-left socket) each contain a fan module 202 position therein. The cover 100 of each of these sockets is thus in the first (stowed position), to allow the fan modules to be inserted into the sockets. Thus, even though the fan module 202 has been removed from the upper-left socket, the cover 100 installed at that socket prevents air from recirculating back through the empty socket.

FIG. 3B is a front view of the housing 200 of FIG. 3A, showing a socket 204A and a socket 204B. The socket 204A is a socket in the upper row of the housing 200, while socket 204B is positioned directly below socket 204A. In FIG. 3B, the cover 100 is installed at socket 204A and is in the second position to block the socket 204A. A cover is also installed at socket 204B, although this cover is generally not visible. The socket 204A includes sidewalls 206A and 206B, a wall 208A, and a wall 208B. The wall 208A is an upper wall formed by the top wall of the housing 200, since the socket 204A is in the upper row of the housing 200. The wall 208B is a lower wall of the socket 204, and also forms the upper wall of socket 204B.

As shown, when the cover 100 is in the second position to block the socket 204A, the ridges 125B that extend from the lower edge of the cover 100 contact the top side of the wall 208B. Similarly, when the cover installed at the socket 204B is in the closed position, the ridges 125A that extend from the upper edge of the cover contact the underside of the wall 208B. Similarly, ridges 125A of cover 100 contact wall 208A, ridges 125C contact sidewall 206A, and ridges 125D contact sidewall 206B. The ridges 125A-125D can be resilient, such that the ridges 125A-125D act as springs, and can exert a force against the walls of the socket 204AA when the cover 100 is in the second position. The ridges 125A-125D of the cover 100 thus aid in maintaining contact between the cover 100 and the walls of the socket 204A, when the cover 100 is in the second position. The ridges 125A-125D of any one of the covers also extend toward the ridges 125A-125D, such that the electrically conductive material of adjacent covers is as close as possible. This aids in minimizing the amount of electromagnetic interference that disrupts the operation of the fan modules.

Referring now to FIGS. 4A-8, the cover 100 can be movably coupled to a housing of a computing device so that the cover 100 is movable relative to a socket defined by the housing. In some implementations, the cover 100 is slidably and rotatably coupled to the housing via the bosses 106A and 106B. Other techniques to couple the cover 100 to the housing can be used.

The cover 100 is thus able to move between a first position and a second position. In the first position (shown in FIG. 4A), the cover 100 allows for components (such as a fan module) to be inserted into the socket through an opening of the socket. In the second position (shown in FIG. 8), the cover 100 prevents a component (such as a fan module) from being inserted into the socket through the opening. Thus, the cover 100 in the first position allows access to the socket through the opening, and the cover 100 in the second position prevents access to the socket through the opening.

Figure 4A:
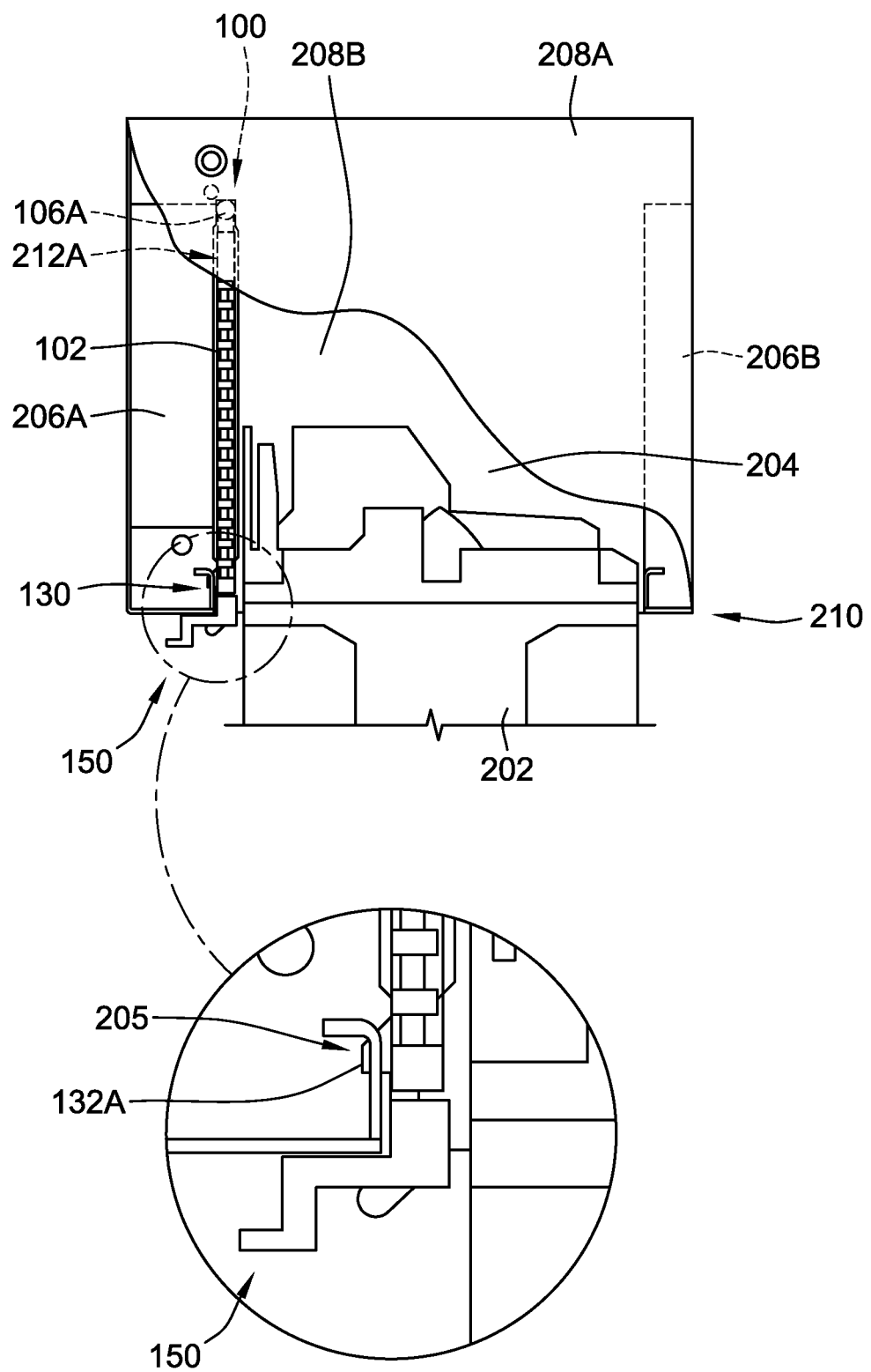
FIG. 4A is a top view of a fan module partially inserted into a socket of a fan wall and the example cover of FIG. 1A locked in a first position, according to aspects of the present disclosure.

FIG. 4A is a top view of a socket 204 of a fan wall, with a fan module 202 partially inserted into the socket 204 and the cover 100 locked in the first position. The socket 204 is defined by a first sidewall 206A, a second sidewall 206B, an upper wall 208A, and a lower wall 208B. The second sidewall 206B is spaced apart from the first sidewall 206A. The upper wall 208A is coupled to a first end of the first sidewall 206A and a first end of the second sidewall 206B. The lower wall 208B is spaced apart from the upper wall 208A, and is coupled to a second opposing end of the first sidewall 206A and a second opposing end of the second sidewall 206B.

The first sidewall 206A, the second sidewall 206B, the upper wall 208A, and the lower wall 208B are generally all components of the housing of a computing device (such as a server device). The socket 204 may be part of a larger fan wall that includes a plurality of sockets that are the same as or similar to the socket 204. The fan module 202 is inserted into the socket 204 through an opening 210 that is located at a front end of the socket 204. The front end of the socket 204 is defined by the front edges of the first and second sidewalls 206A and 206B, the upper wall 208A, and the lower wall 208B, and is proximal to the opening 210 of the socket 204. A back end of the socket 204 is defined by the back edges of the first and second sidewalls 206A and 206B, the upper wall 208A, and the lower wall 208B, and is distal to the opening 210 of the socket 204.

The cover 100 is movably coupled to the housing via the bosses 106A and 106B (boss 106B shown in FIG. 1A). The bosses 106A and 106B are configured to be inserted into tracks defined by the housing. The upper wall 208A includes a track 212A into which the boss 106A can be inserted. The lower wall 208B includes a track 212B (FIG. 6) that the boss 106B can be inserted into. The bosses 106A and 106B are slidable within the tracks 212A and 212B so that the cover 100 can slide relative to the socket 204. When in the first position, the bosses 106A, 106B are positioned near a back end of the socket 204, and the first locking mechanism 130 and the release tab 150 are located near a front end of the socket 204. When the cover 100 is in the first position, the body 102 of the cover 100 is positioned next to and parallel with the first sidewall 206A. Thus, in the first position, the cover 100 allows the fan module 202 to be inserted into and removed from the socket 204 through the opening 210. When the fan module 202 is inserted into the socket 204, the fan module 202 is generally positioned between the cover 100 and the second sidewall 206B.

The first locking mechanism 130 is configured to releasably attach to the housing to secure the cover 100 in the first position. FIG. 4A includes is a zoomed-in inset view of the first locking mechanism 130 attached to the first sidewall 206A. The protrusions 132A and 132B (132B shown in FIG. 2A) are configured to extend through one or more apertures 205 that are defined in the first sidewall 206A. In some implementations, the one or more apertures 205 include a single aperture 205 defined in the first sidewall 206A, and both protrusions 132A, 132B extend through the aperture 205. In other implementations, the first sidewall 206A defines separate apertures 205 through which the protrusions 132A, 132B extend.

In one implementation, the protrusions 132A, 132B are slightly larger than the aperture 205. A portion of or all of the protrusions 132A, 132B may thus abut an edge of the aperture 205, thereby preventing the cover 100 from being secure in the first position. To secure the cover 100 in the first position, force is applied to the protrusions 132A, 132B (for example via the release tab 150), which can then flex or deform slightly so that the protrusions 132A, 132B can momentarily pass through the aperture 205. Then, the protrusions 132A, 132B can return to their un-flexed state. In the un-flex state, the protrusions 132A, 132B can again abut an edge of the aperture 205, but on the opposite side of the aperture 205, thereby preventing the cover 100 from being moved out of the first position. When the cover 100 is in the first position, the release tab 150 extends out of the opening 210 of the socket 204, between the first sidewall 206A and the fan module 202. Thus, the release tab 150 is accessible by a technician when the cover 100 is in the first position.

In other implementations, the first locking mechanism 130 can have any number of different characteristics. For example, the first locking mechanism 130 can include a different number of protrusions (e.g., one protrusion, three protrusions, etc.). The first locking mechanism 130 can include protrusions having different shapes (e.g., cylindrical, rectangular, etc.). The first locking mechanism 130 can also include a clip, a clamp, a pin, a rod, etc. For example, the first locking mechanism 130 can include a hook that is configured to extend through the aperture 205, such that a portion of the first sidewall 206A is disposed between a portion of the hook and the cover 100. The hook thus secures the cover 100 in the first position.

Figure 4B:
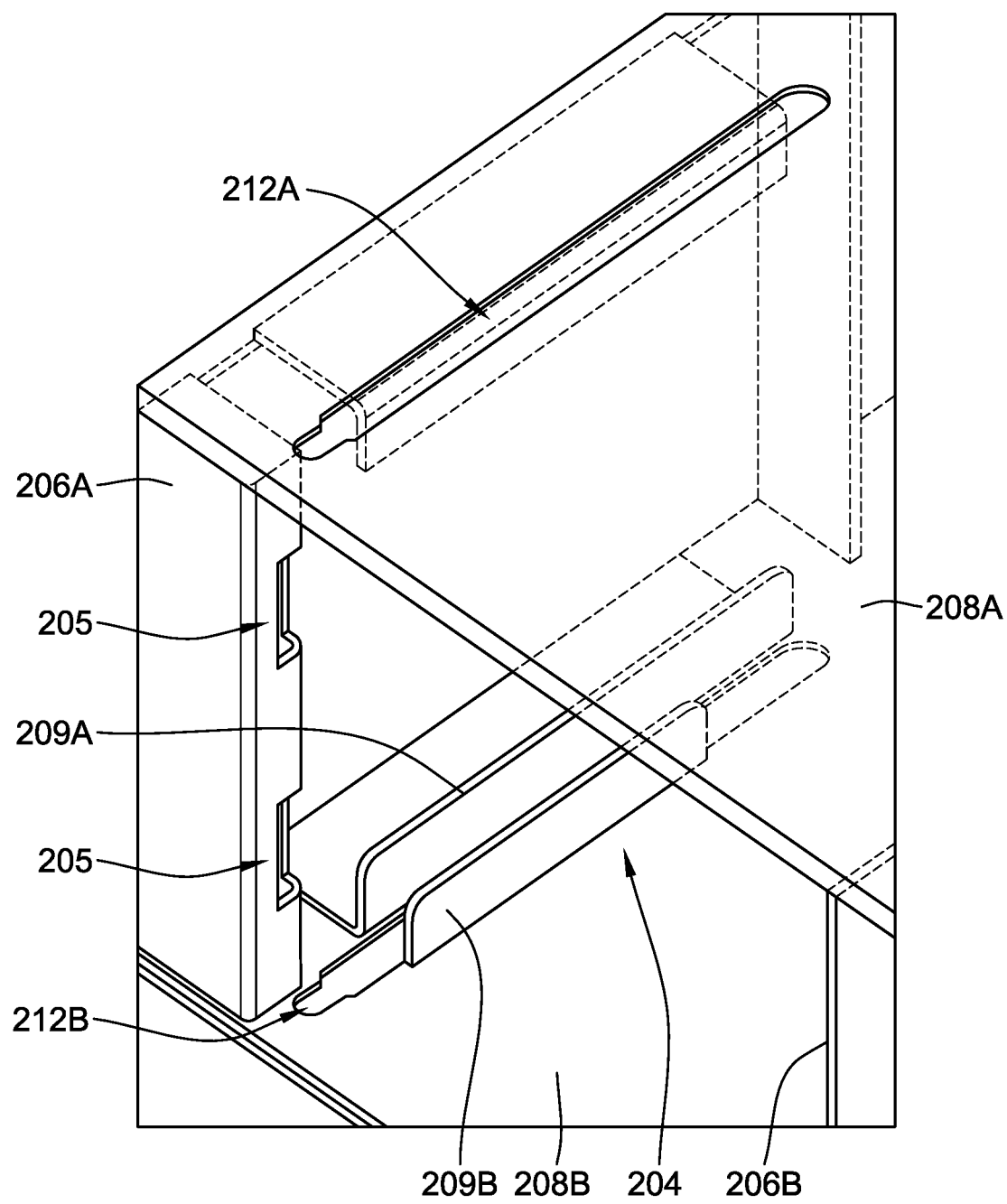
FIG. 4B is a perspective view of the socket of FIG. 4A, with the fan module and the cover removed, according to aspects of the present disclosure.

FIG. 4B is a perspective view of the socket 204 of FIG. 4A, with both the cover 100 and the fan module 202 removed. As shown, the upper wall 208A defines the track 212A, while the lower wall 208B defines the track 212B. When the cover 100 is installed in the socket 204, the boss 106A is inserted into the track 212A, while the boss 106B is inserted into the track 212B. The bosses 106A, 106B are movable within their respective tracks 212A, 212B, to couple the cover 100 to the walls of the socket, and to allow the cover 100 to move along the tracks 212A, 212B.

FIG. 4B also shows the apertures 205 that are defined in the first sidewall 206A. In the illustrated implementation, the sidewall 206A defines two apertures 205. The upper aperture 205 receives protrusion 132A of the cover 100 (FIG. 2A), while the lower aperture 205 receives protrusion 132B of the cover 100 (FIG. 2A). Finally, the socket 204 can includes two walls 209A and 209B that extend upwardly along the sides of the track 212B. Wall 209A extends upward from the lower wall 208B adjacent to the side of the track 212B closest to the sidewall 206A. Wall 209B extends upward from the lower wall 208B adjacent to the other side of the track 212B, that is closest to the sidewall 206B. The walls 209A and 209B aid in ensuring that the boss 106B stays seated in the track 212B, and that the cover 100 does not inadvertently become decoupled from the walls of the socket 204. The walls 209A and 209B also aid in ensuring that the cover 100 remains spaced apart from the rest of the socket 204 when in the first position, so that the fan module does not inadvertently contact the cover 100 when the fan module is being inserted into the socket 204 or removed from the socket 204.

Figure 5:
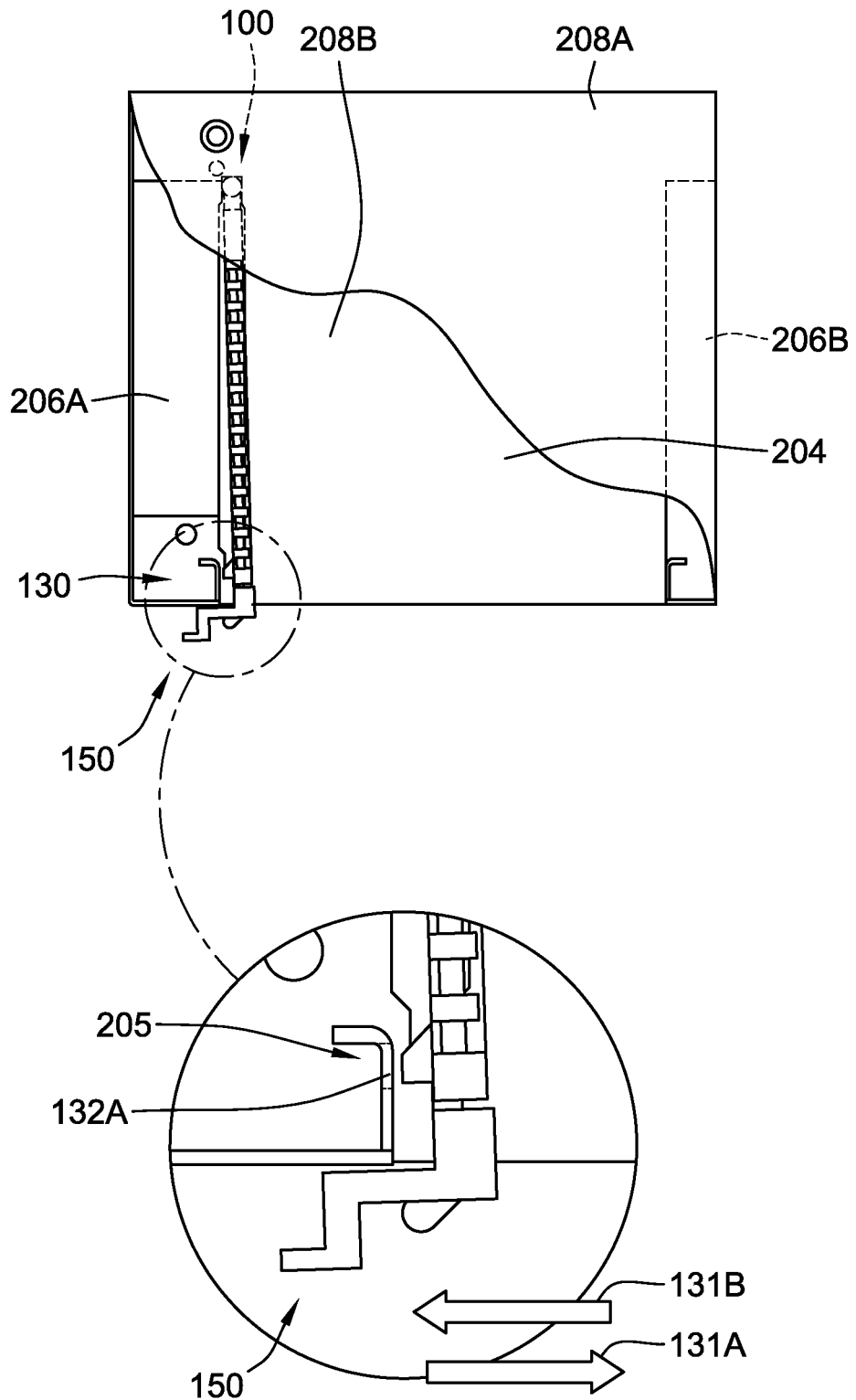
FIG. 5 is a top view of the socket of FIG. 4A with the fan module removed and the example cover unlocked from the first position, according to aspects of the present disclosure.

FIG. 5 is a top view of the socket 204 with the fan module 202 removed from the socket 204, and the cover 100 unlocked from the first position. Once the fan module is removed from the socket 204, a user or technician can press on the release tab 150, so as to impart a force in the direction of arrow 131A and detach the first locking mechanism 130 from the first sidewall 206A. As shown in the zoomed-in inset view, pressing on the release tab 150 in this manner causes the protrusions 132A, 132B (132B shown in FIG. 5A) to be removed from the aperture 205 and detach from the first sidewall 206A. Thus, the first locking mechanism 130 ensures that the cover 100 remains in the first position when the fan module 202 is removed, until the first locking mechanism 130 is detached from the first sidewall 206A via operation of the release tab 150. To attach the first locking mechanism 130 to the first sidewall 206A, the technician can press on the release tab to impart a force in the direction of arrow 131B.

Figure 6:
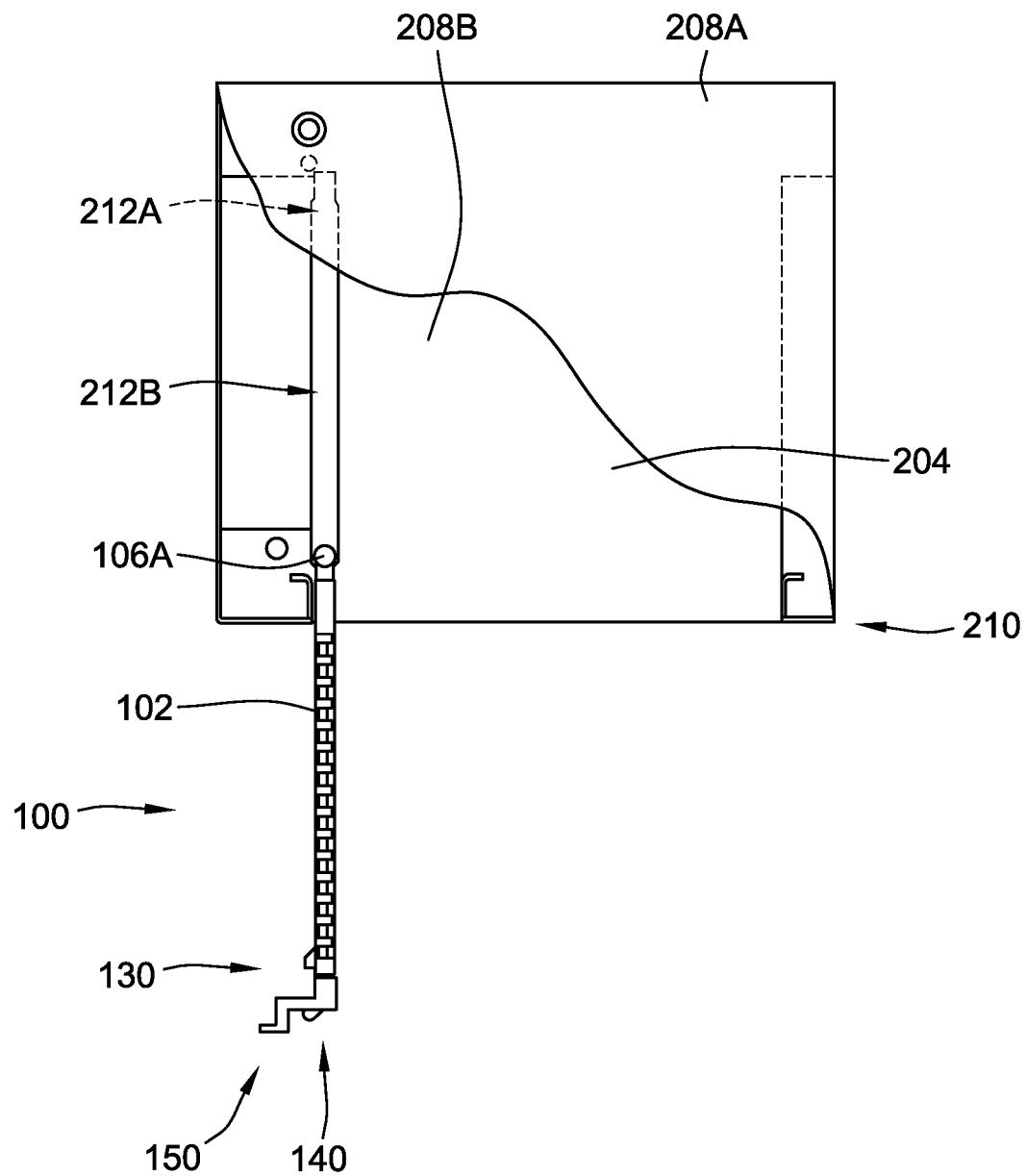
FIG. 6 is a top view of the socket of FIG. 4A with the fan module removed and the example cover in an intermediate position, according to aspects of the present disclosure.

FIG. 6 is a top view of the socket 204 after the cover 100 has been moved from the first position to an intermediate position. The boss 106A is inserted into the track 212A defined in the upper wall 208A, and the boss 106B (shown in FIG. 1A) is inserted into the track 212B defined in the lower wall 208B. Thus, a technician can pull the body 102 out of the socket 204, such that the bosses 106A, 106B slide within the tracks 212A, 212B and the cover 100 moves the intermediate position. As shown in FIG. 6, in the intermediate position, the bosses 106A, 106B are positioned near the opening 210 located at the front end of the socket 204. A portion of the body 102 of the cover 100 that includes the bosses 106A, 106B remains disposed within the socket 204, while the majority of the cover 100 extends out of the socket 204 through the opening 210. The first locking mechanism 130, the second locking mechanism 140, and the release tab 150 are all positioned outside of the socket 204 when the cover 100 is in the intermediate position. In the intermediate position, the cover 100 allows a component to be inserted into the socket 204, similar to the first position.

Figure 7A:
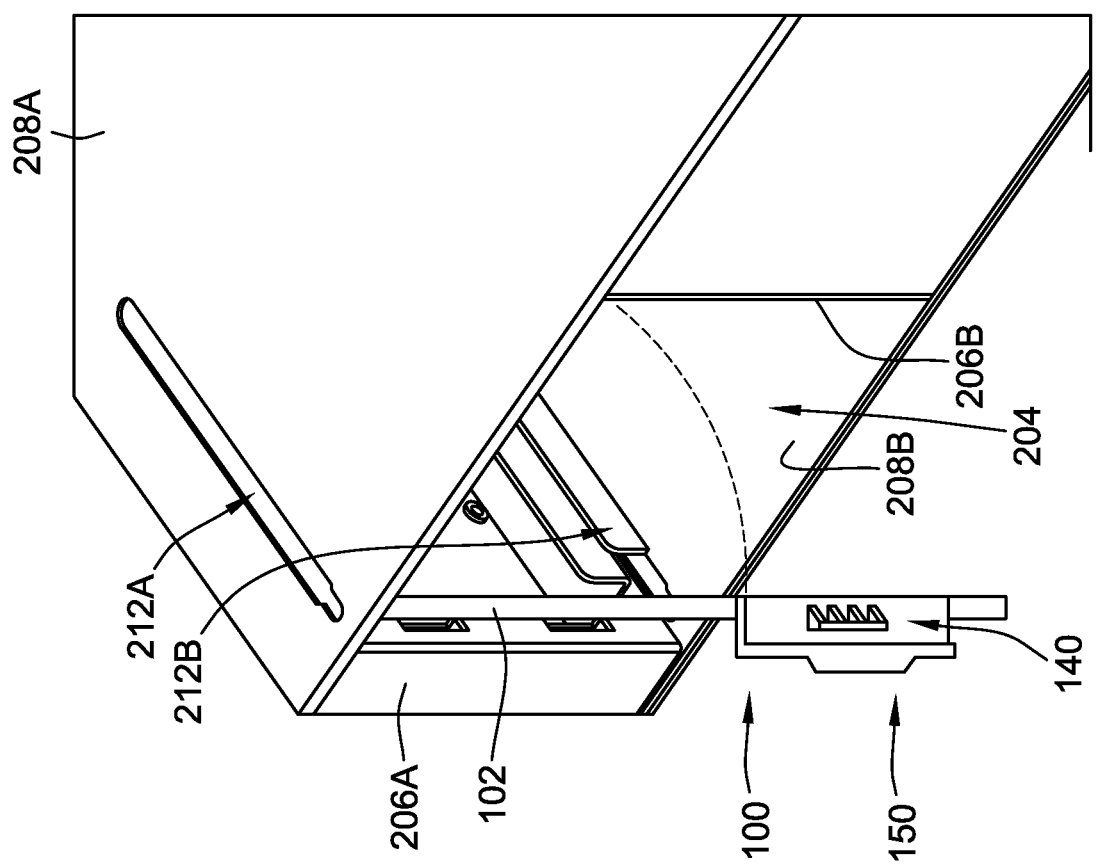
FIG. 7A is a perspective view of the socket of FIG. 4A with the fan module removed as the example cover moves from the intermediate position to a second position, according to aspects of the present disclosure.

FIG. 7A is a perspective view of the socket 204 while the cover 100 is being moved from the intermediate position of FIG. 6 to the second position. The bosses 106A, 106B (FIG. 1A) are also rotatable within the tracks 212A, 212B. The bosses 106A, 106B thus form a hinge to allow the body 102 of the cover 100 to rotate about the bosses 106A, 106B between the intermediate position and the second position. Generally, a user or a technician will cause the cover 100 to rotate towards the second position, for example by grasping the release tab 150 and moving the cover 100. As the cover 100 rotates to the second position, the second locking mechanism 140 moves away from the first sidewall 206A and approaches the second sidewall 206B. In some implementations, the track 212A defined by the upper wall 208A and the track 212B defined by the lower wall 208B are designed so that the cover 100 may only rotate once the cover 100 is in the intermediate position. In these implementations, the cover 100 cannot rotate when in the first position and disposed within the housing (FIGS. 4 and 5), regardless of whether the first locking mechanism 130 is attached to the first sidewall 206A. In other implementations, the cover 100 can rotate about the bosses 106A, 106B when in the first position, so long as the first locking mechanism 130 has been detached from the first sidewall 206A.

FIG. 7B is a zoomed-in view of the boss 106A of the cover 100, as the cover 100 is moved from the intermediate position to the second position. When the cover 100 moves to the second position, the boss 106A rotates about an axis 107 that is normal to the top surface of the boss 106A, within the channel 212A that is defined in the upper wall 208A. As the boss 106A rotates, the cover 100 itself rotates away from the sidewall 206A, to the second position. In some implementations, the end of the channel 212A that the boss 106A rotates within forms a neck 213 that is narrower than the rest of the channel 212A. The neck aids in retaining the boss 106A at the end of the channel 212A as the cover 100 is moved from the intermediate position to the second position.

Figure 8:
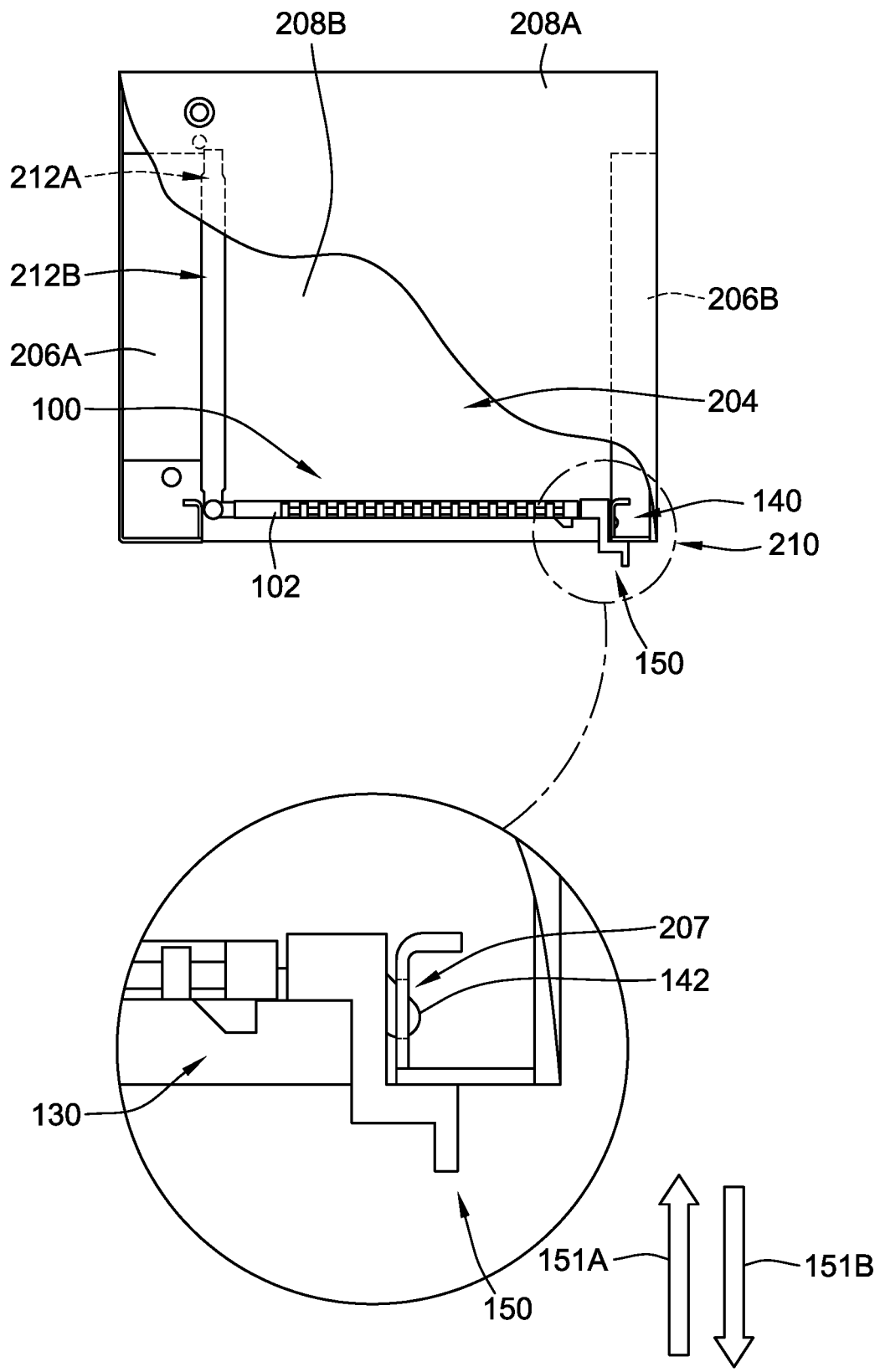
FIG. 8 is a top view of the socket of FIG. 4A with the fan module removed and the example cover locked in the second position, according to aspects of the present disclosure.

FIG. 8 is a top view of the socket 204 after the cover 100 has fully rotated to the second position, and the cover 100 is locked in the second position. In the second position, the body 102 of the cover 100 is disposed at the front edge of the socket 204, and extends from the first sidewall 206A to the second sidewall 206B. Because the body 102 of the cover 100 also extends from the upper wall 208A to the lower wall 208B, the cover 100 prevents components (such as the fan module) from being inserted into the socket 204 through the opening 210. The cover 100 also blocks a substantial amount of airflow through the opening 210 of the socket 204. In the second position, the second locking mechanism 140 is positioned adjacent to the second sidewall 206B.

To secure the cover 100 in the second position, the user or technician can impart a force on the release tab 150 in the direction of the arrow 151A. As shown in the zoomed-in inset view of FIG. 8, this force causes the protrusion 142 of the second locking mechanism 140 to extend through an aperture 207 that is defined in the second sidewall 206B. The protrusion 142 is secured to the second sidewall 206B in a similar manner as the first locking mechanism 130. The protrusion 142 can be slightly larger than the aperture 207. Some or all of the protrusion 142 may thus abut an edge of the aperture 207. The applied force on the release tab 150 in the direction of arrow 151A causes the protrusion 142 to flex or deform slightly, allowing the protrusion 142 to pass through the aperture 207. To detach the second locking mechanism 140 from the second sidewall 206B, the user or technician can press on the release tab 150, so as to impart a force in the direction of arrow 151B. Pressing on the release tab 150 in this manner can again cause the protrusion 142 to flex or deform slightly, which allows the protrusion 142 to be removed from the aperture 207, and detach from the second sidewall 206B.

In other implementations, the second locking mechanism 140 can have any number of different characteristics. For example, the second locking mechanism 140 can include a different number of protrusions (e.g., two protrusions, three protrusions, etc.). The second locking mechanism 140 could include a protrusion having a different shape (e.g., cylindrical, rectangular, etc.). The second locking mechanism 140 can also include a clip, a clamp, a pin, a rod, etc. For example, the second locking mechanism 140 can include a hook that is configured to extend through the aperture 207, such that a portion of the second sidewall 206B is disposed between a portion of the hook and the cover 100. The hook thus secures the cover 100 in the second position.

When the cover 100 is in the second position, the release tab 150 extends out of the opening 210 of the socket 204, near the second sidewall 206B. Thus, the release tab 150 is accessible by a technician when the cover 100 is in the second position.

While FIGS. 4-8 illustrate the cover 100 being coupled to the first sidewall 206A of the socket 204, the cover 100 can generally be coupled to any of the walls of the socket 204. For example, the cover 100 can be coupled to the second sidewall 206B and be configured to rotate toward the first sidewall 206A; coupled to the upper wall 208A and be configured to rotate toward the lower wall 208B; or coupled to the lower wall 208B and be configured to rotate toward the upper wall 208A.

Further, the cover can be used to cover sockets that house components other than fan modules, such as power supply units, slide modules, hard drive disk carriers, add-on modules, etc. The cover can thus have generally any desired shape and size, depending on the application. In some implementations, the size and shape of the cover matches the size and shape of the component being inserted into the socket. In other implementations, the size and shape of the cover does not match the size and shape of the component being inserted into the socket. However, in any of these implementations, the cover has a size and shape that generally matches the size and shape of the socket itself.

Figure 9A:
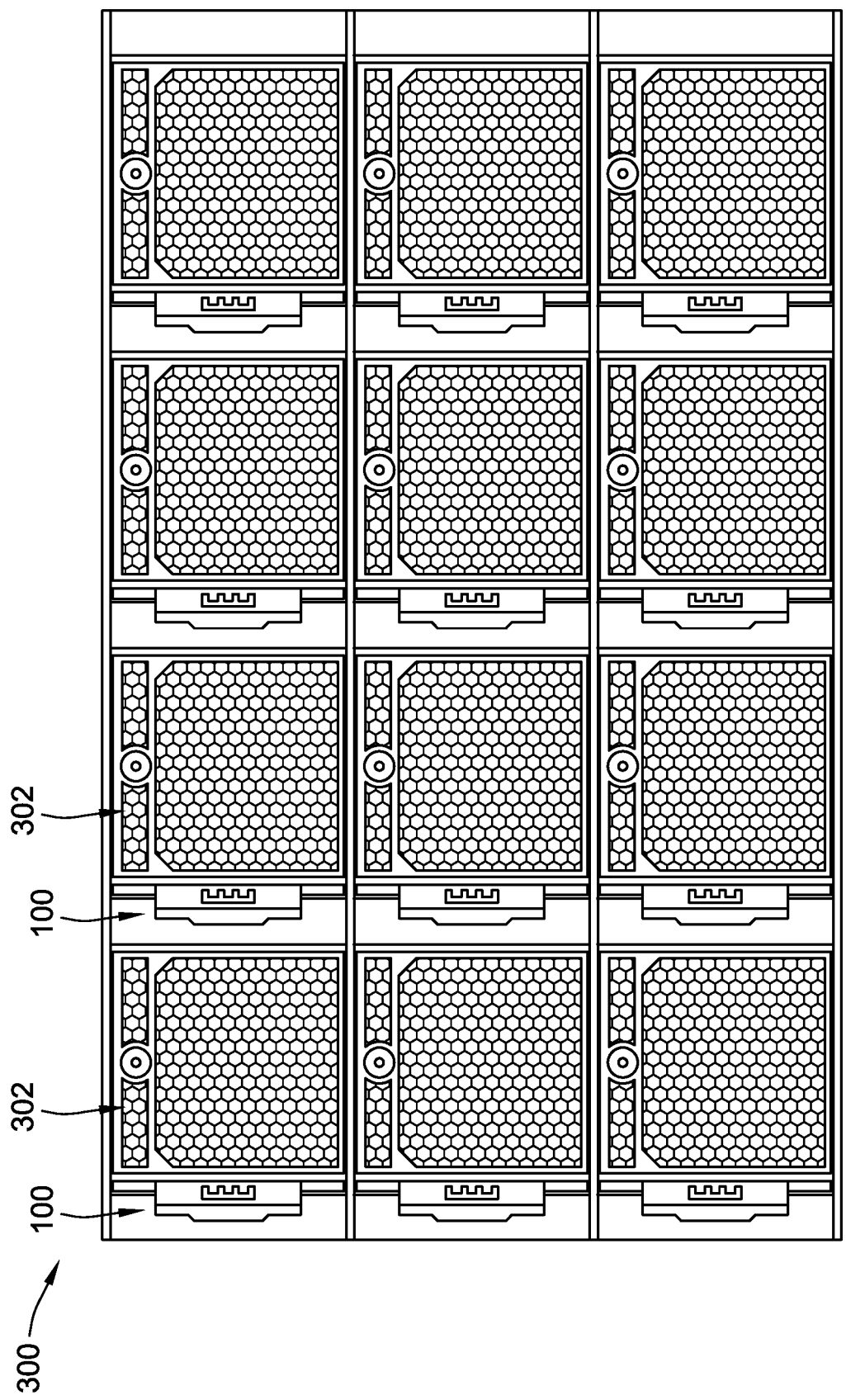
FIG. 9A is a front view of a fan wall where each socket contains a fan module, and where each socket has an example cover coupled thereto in the first position, according to aspects of the present disclosure.

FIG. 9A shows a first implementation of a housing 300 having twelve sockets. Each socket of the housing 300 contains a fan module 302 disposed therein. Fan module 302 can be the same as or similar to fan module 202 of FIGS. 3A and 3B. The cover 100 installed at each socket of the housing 300 is thus in the first position. In the first position, the covers 100 allow the fan modules 302 to be inserted into the sockets.

Figure 9B:
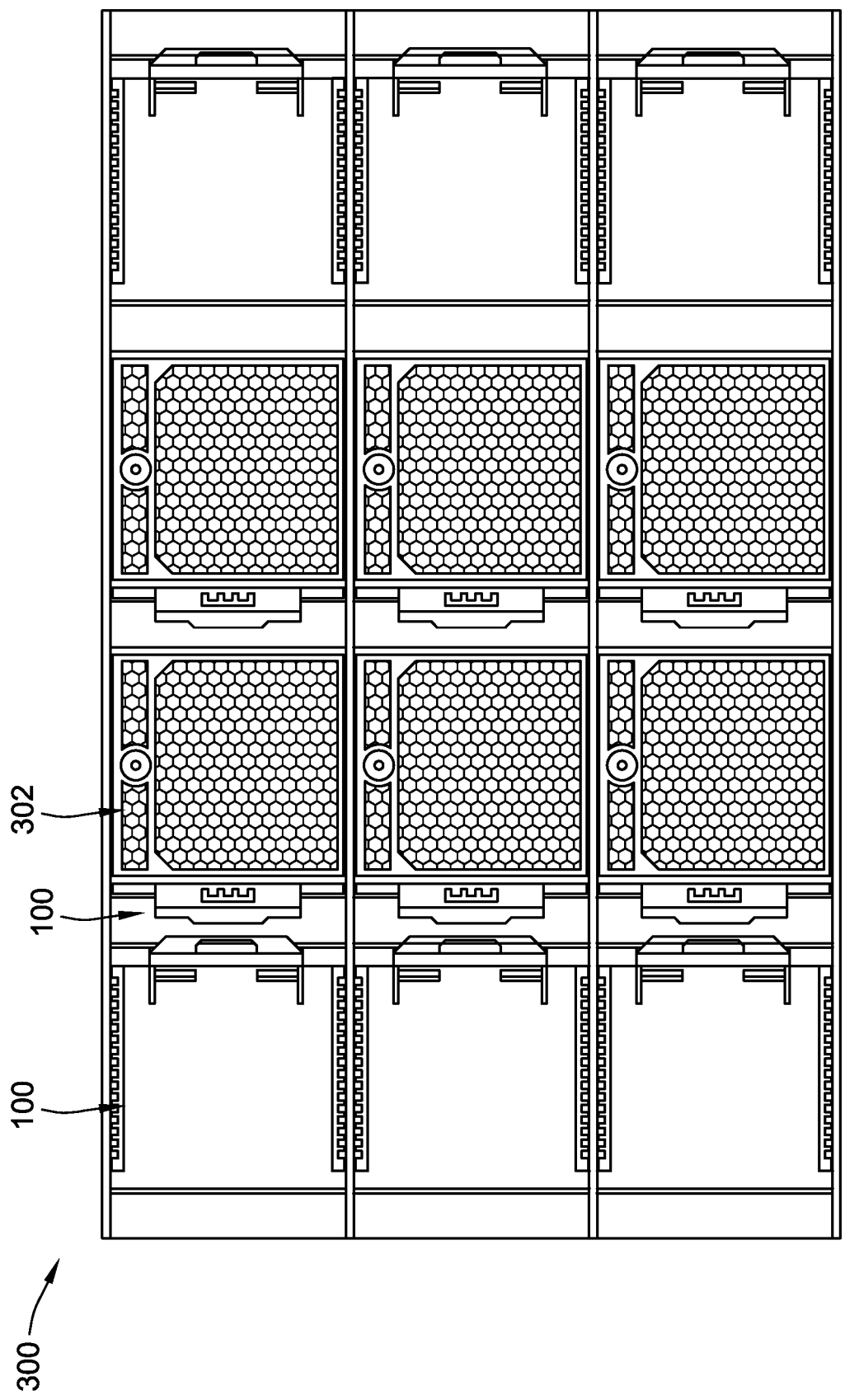
FIG. 9B is a front view of the fan wall of FIG. 9A, where some sockets are empty, and where each empty socket has the example cover coupled thereto in the second position, according to aspects of the present disclosure.

FIG. 9B shows a second implementation of the housing 300. In the second implementation, only half of the sockets of the housing 300 contain a fan module 302 disposed therein. The covers 100 installed at the sockets containing the fan modules 302 are thus in the first position. However, the covers 100 installed at the sockets without fan modules 302 are moved to the second position. In the second position, the covers 100 block the sockets, which prevents fan modules 302 from being inserted into the sockets and prevents air from flowing through the sockets. The covers 100 thus allow the same housing 300 to be used with different numbers of fan modules 302.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation.

Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A cover for covering an opening of a socket of a housing, the cover comprising:
   a body;
   one or more bosses extending from the body, the one or more bosses being configured to movably couple the body to the housing, such that the body is movable between a first position and a second position;
   a first locking mechanism formed on a first surface of the body, the first locking mechanism being configured to releasably attach to a first wall of the housing to secure the body in the first position;
   a second locking mechanism formed on a second surface of the body different than the first surface, the second locking mechanism configured to releasably attach to a second wall of the housing to secure the body in the second position; and
   a release tab operable to aid in causing the first locking mechanism to detach from the first wall and the second locking mechanism to detach from the second wall,
   wherein when the body is moved to the first position, the body allows access to the socket through the opening, and
   wherein when the body is moved to the second position, the body prevents access to the socket through the opening.

2. The cover of claim 1, wherein the body has a shape that is generally identical to a shape of the opening of the socket.

3. The cover of claim 1, wherein the body includes a first body portion coupled to a second body portion, the first body portion being formed from an electrically insulating material, the second body portion being formed from an electrically conductive material.

4. The cover of claim 3, wherein the one or more bosses, the first locking mechanism, the second locking mechanism, and the release tab are all integrally formed with and extend from the first body portion.

5. The cover of claim 1, wherein the one or more bosses are configured to be inserted into one or more tracks defined by the housing.

6. The cover of claim 5, wherein the one or more bosses include a first boss configured to be inserted into a first track of the housing, and a second boss configured to be inserted into a second track of the housing, the first track being defined by an upper wall of the housing, the second track being defined by a lower wall of the housing.

7. The cover of claim 1, wherein the one or more bosses are configured to move relative to housing such that the body moves from the first position to an intermediate position, and wherein in response to being moved to the intermediate position, the body is configured to rotate about the one or more bosses from the intermediate position to the second position.

8. The cover of claim 7, wherein the body is disposed within the socket when in the first position, wherein the body extends out of the socket through the opening when in the intermediate position, and wherein the body is disposed within the socket when in the second position.

9. The cover of claim 7, wherein when the body is in the first position, the body is unable to rotate about the one or more bosses between the first position and the second position.

10. The cover of claim 1, wherein the socket is configured to receive a fan module, the body allowing the fan module to be inserted into the socket when the body is in the first position, the body blocking airflow through the socket when the fan module is removed from the socket and the body is in the second position.

11. The cover of claim 1, wherein the release tab is configured to cause the first locking mechanism to detach from the first wall of the housing in response to force being imparted on the release tab in a first direction when the body is in the first position, and wherein the release tab is configured to cause the second locking mechanism to detach from the second wall of the housing in response to force being imparted on the release tab in a second direction when the body is in the second position, the first direction being different than the second direction.

12. The cover of claim 11, wherein the release tab is configured to cause the first locking mechanism to attach to the first wall of the housing in response to force being imparted on the release tab in a third direction when the body is in the first position, and wherein the release tab is configured to cause the second locking mechanism to detach from the second wall of the housing in response to force being imparted on the release tab in a fourth direction when the body is in the second position, the third direction being parallel to and opposite of the first direction, the fourth direction being parallel to and opposite of the second direction.

13. The cover of claim 1, wherein when the body is in the second position, the body blocks airflow through the socket.

14. A cover for covering an opening of a socket of a housing, the cover comprising:
   a body that includes a first body portion coupled to a second body portion, the first body portion including one or more projections extending from a surface thereof, the second body portion including one or more apertures defined therethrough, each of the one or more projections being configured to fit into a corresponding one of the one or more apertures;
   one or more bosses extending from the body, the one or more bosses being configured to movably couple the body to the housing, such that the body is movable between a first position and a second position;
   a first locking mechanism configured to releasably attach to a first wall of the housing to secure the body in the first position;
   a second locking mechanism configured to releasably attach to a second wall of the housing to secure the body in the second position; and
   a release tab operable to aid in causing the first locking mechanism to detach from the first wall and the second locking mechanism to detach from the second wall,
   wherein when the body is moved to the first position, the body allows access to the socket through the opening, and wherein when the body is moved to the second position, the body prevents access to the socket through the opening.

15. A cover for covering an opening of a socket of a housing, the cover comprising:
a body;
one or more bosses extending from the body, the one or more bosses being configured to movably couple the body to the housing, such that the body is movable between a first position and a second position;
a first locking mechanism configured to releasably attach to a first wall of the housing to secure the body in the first position, the first locking mechanism including a first protrusion extending from the body and configured to be inserted through an aperture define in the first wall of the housing;
a second locking mechanism configured to releasably attach to a second wall of the housing to secure the body in the second position; and
a release tab operable to aid in causing the first locking mechanism to detach from the first wall and the second locking mechanism to detach from the second wall,
wherein when the body is moved to the first position, the body allows access to the socket through the opening, and
wherein when the body is moved to the second position, the body prevents access to the socket through the opening.

16. The cover of claim 15, wherein the first protrusion is larger than the aperture defined in the first wall, and wherein the first protrusion is configured to deform in response to force being applied to the first protrusion, thereby allowing the first protrusion to pass through the aperture defined in the first wall.

17. The cover of claim 15, wherein the second locking mechanism includes a second protrusion extending from the body and configured to be inserted through an aperture defined in the second wall of the housing.

18. The cover of claim 17, wherein the second protrusion is larger than the aperture defined in the second wall, and wherein the second protrusion is configured to deform in response to force being applied to the second protrusion, thereby allowing the second protrusion to pass through the aperture defined in the second wall.

19. The cover of claim 17, wherein the release tab is configured to cause the first projection to detach from the first wall in response to a first force being imparted on the release tab when the body is in the first position, and wherein the release tab is configured to cause the second projection to detach from the second wall in response to a second force being imparted on the release tab when the body is in the second position.

* * * * *